United States Patent [19]

Akashi et al.

[11] Patent Number: 5,289,339
[45] Date of Patent: Feb. 22, 1994

[54] PORTABLE ELECTRONIC DEVICE WITH MEMORY CARD UNIT HAVING SYMMETRICAL TERMINALS

[75] Inventors: Kazuo Akashi; Yuji Yamanaka, both of Oome, Japan

[73] Assignee: Kabushiki Kaisha Toshiba, Kawasaki, Japan

[21] Appl. No.: 74,727

[22] Filed: Jun. 10, 1993

Related U.S. Application Data

[63] Continuation of Ser. No. 542,047, Jun. 22, 1990, abandoned.

[30] Foreign Application Priority Data

Jun. 28, 1989 [JP] Japan ................................ 1-165677
Jun. 28, 1989 [JP] Japan ................................ 1-165678

[51] Int. Cl.$^5$ ............................................. H05K 7/10
[52] U.S. Cl. ................................ 361/684; 361/737; 439/924

[58] Field of Search .................... 235/492; 439/55, 59, 439/60, 64, 637, 924; 400/121, 692; 174/117 F, 261; 361/380, 390-395, 399, 413, 415, 679-686, 725-727, 737, 785, 796; 364/708, 708.1; 273/435

[56] References Cited

U.S. PATENT DOCUMENTS

| | | | |
|---|---|---|---|
| 3,928,750 | 12/1975 | Wölflingseder | 235/492 X |
| 4,725,924 | 2/1988 | Juan | 235/492 X |
| 4,780,793 | 10/1988 | Ohtsuki | 361/399 |
| 5,044,963 | 9/1991 | Kukkonen et al. | 439/55 |

Primary Examiner—Leo P. Picard
Assistant Examiner—Michael W. Phillips
Attorney, Agent, or Firm—Oblon, Spivak, McClelland, Maier & Neustadt

[57] ABSTRACT

In a device such as a personal computer having a memory card unit, terminals of a memory card are arranged symmetrically about power source terminals. When a memory card is inserted upside down into a memory card unit, the power source terminals are connected to a connector of a unit as in a normal operation, and other terminals are connected to identical types of terminals of the connector.

4 Claims, 6 Drawing Sheets

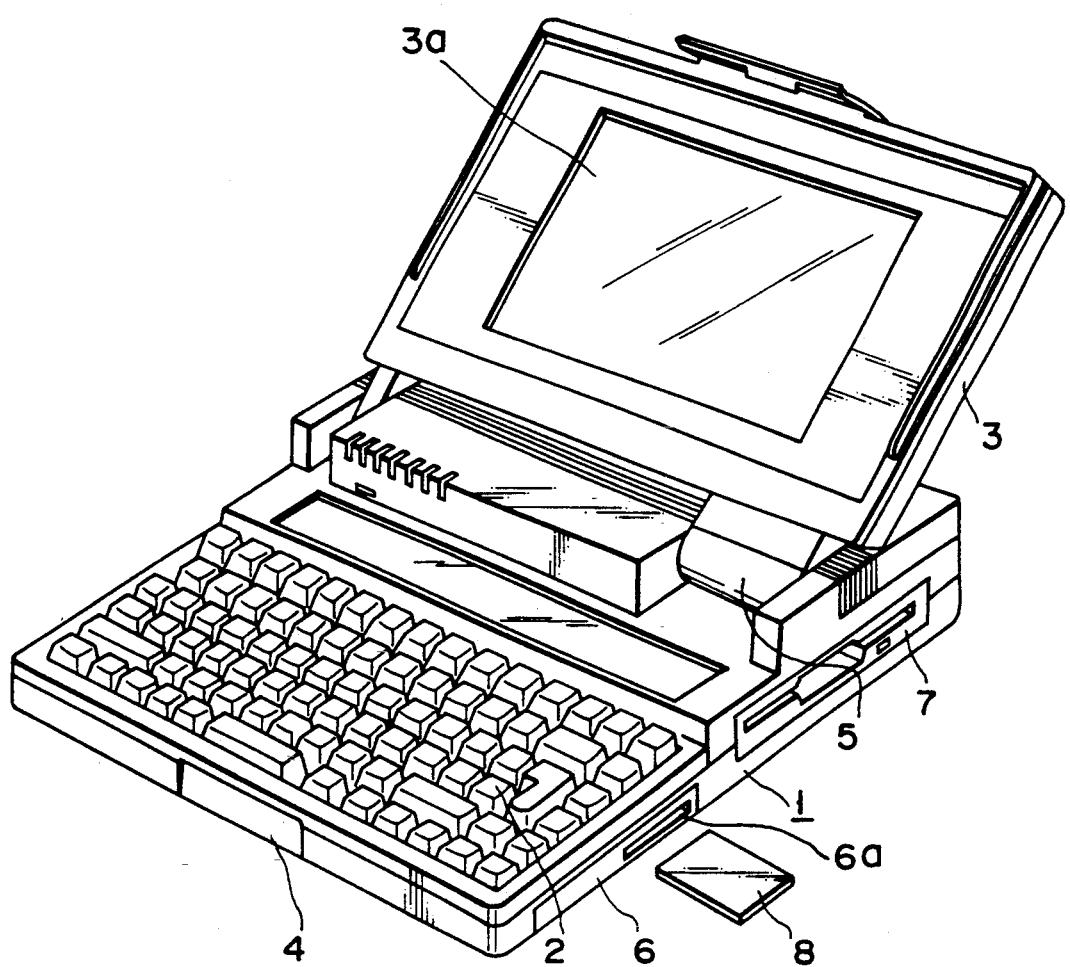
F I G. 1

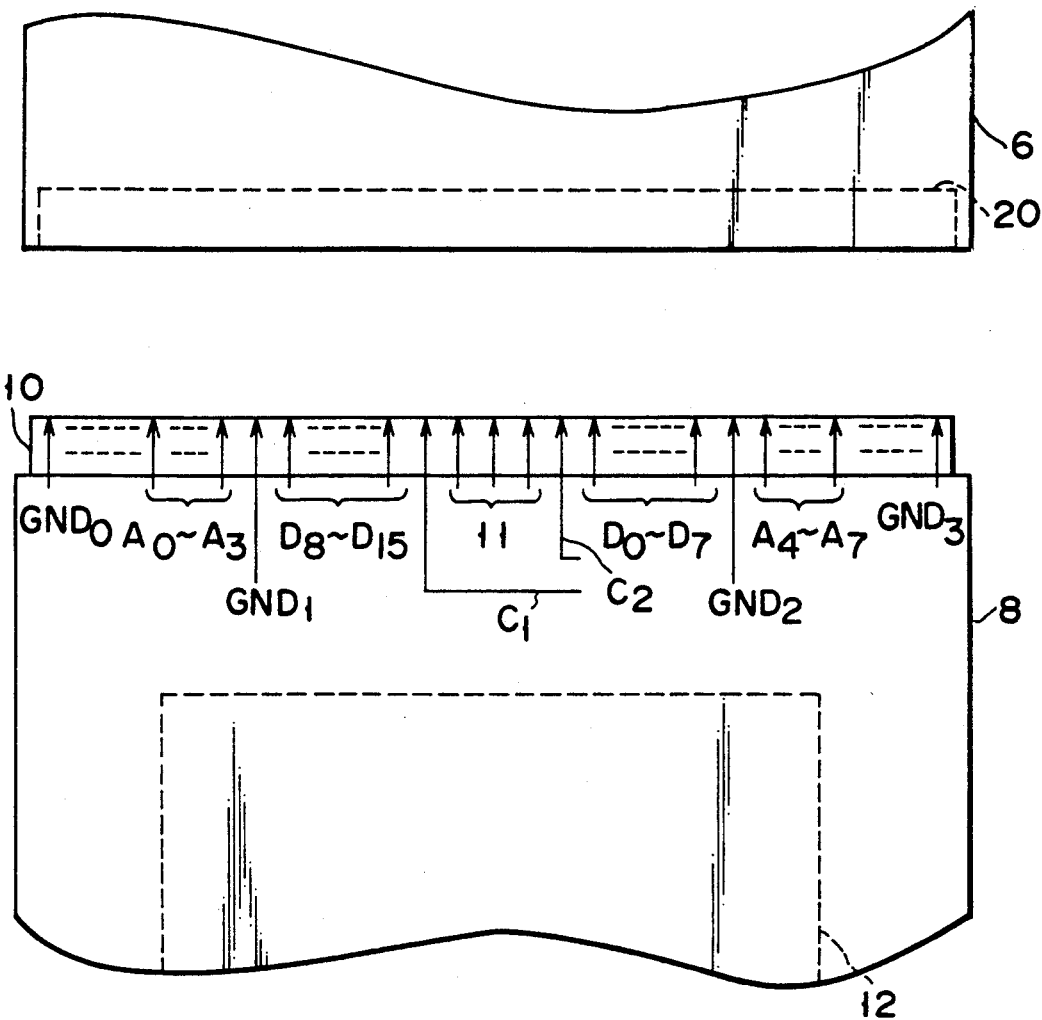
F I G. 2

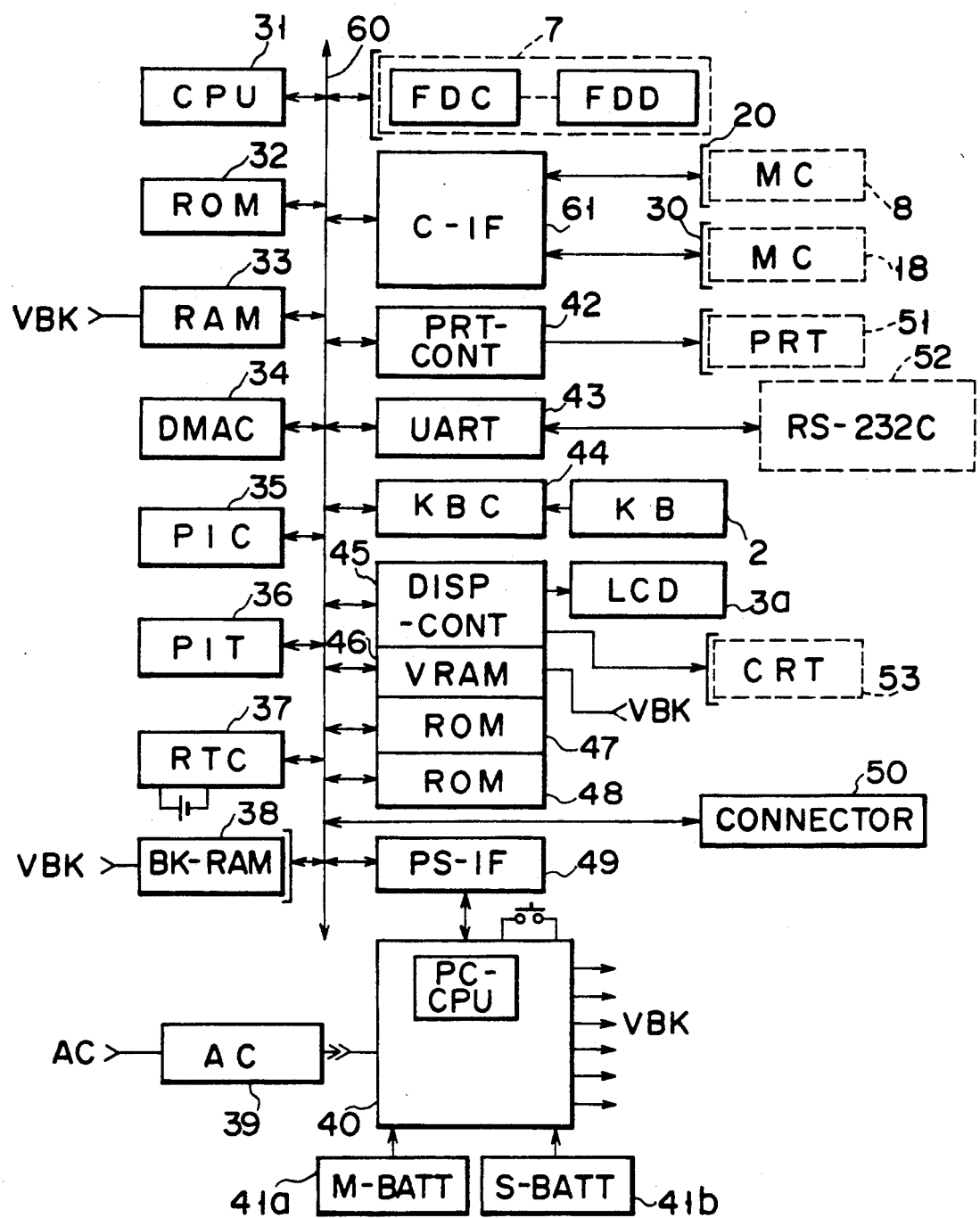
F I G. 4

PORTABLE ELECTRONIC DEVICE WITH MEMORY CARD UNIT HAVING SYMMETRICAL TERMINALS

This application is a Continuation of application Ser. No. 07/542,047, filed on Jun. 22, 1990, now abandoned.

BACKGROUND OF THE INVENTION

1. Field of the Invention

The present invention relates to a portable electronic device such as a lap-top type personal computer or wordprocessor and, more particularly, to a device having a memory card unit.

2. Description of the Related Art

In recent years, portable electronic devices such as lap-top type personal computers and wordprocessors have been developed. Some devices have memory card units in addition to floppy disk drives (FDDs) as external memories. In such a device, a memory card unit is stored in a housing of the device, and a memory card used as a memory medium is inserted into the memory card unit. The memory card serves as an external memory. The memory card has a housing, and the housing has a card base consisting of a plastic plate-like member. A memory circuit consisting of integrated circuits (LSIs) is mounted on the card base. A plurality of terminals (i.e., a connector consisting of contact holes) electrically connected to the memory circuit is arranged at the distal end portion of the card base.

The memory card unit has a box-like case for holding a memory card inserted into a card slot formed in a case unit constituting the housing of the device A connector corresponding to the plurality of terminals of the memory card is arranged in the box-like case. The connector is electrically connected to a predetermined circuit (external memory control circuit) on a printed circuit board to electrically connect the memory card to the printed circuit board.

The memory card may be erroneously inserted upside down into the memory card unit through the card slot. In this case, i.e., in an abnormal insertion state, the plurality of terminals arranged at the distal end portion of the memory card are electrically connected to the connector of the unit. When the card is inserted upside down as described above, the terminals of the memory card are not connected to the predetermined terminals of the connector but to other terminals. For this reason, for example, an abnormal circuit is formed by connections of a high-voltage power source terminal of the connector and a data input/output (I/O) terminal of the memory card. In this abnormal circuit, an abnormal current flows in a memory circuit of the memory card or a circuit (e.g., a data processing circuit mounted on the printed circuit board) on the housing of the device, and one or both of the memory circuit and the circuit on the housing of the device may malfunction.

In the device having the memory card unit as described above, the memory capacity of the memory card is smaller than that of a disk used in the FDD. For this reason, it is not so advantageous to use a memory card as an external memory medium in place of an FDD disk in practice. The memory cards have been used in application fields which require a small memory capacity and have limited operating conditions.

SUMMARY OF THE INVENTION

It is an object of the present invention to provide a portable electronic device such as a personal computer having a memory card unit, wherein a malfunction in one or both of a memory circuit of a memory card and each circuit of the device can be prevented even if the memory card is inserted upside down in the unit.

It is another object of the present invention to provide a practical external memory system by using a memory card as an external memory medium having a relatively large capacity.

A memory card according to the present invention comprises a card base constituting a housing of the card and mounted with a memory circuit, and connector means for connecting the memory circuit and an external device, the connector means being arranged on a flat surface of a distal end portion of the card case connected to the external device, and the connector means having a power source terminal connected to the memory circuit as a central terminal and symmetrical data input/output, address, and control signal terminals connected to the memory circuit.

In this memory card, when the memory card is inserted upside down into the memory card unit, the terminals of the card are connected to the predetermined terminals of the connector of the external device. Therefore, even if the card is inserted upside down, connection of the card terminals to undesirable connector terminals, and formation of an abnormal circuit can be prevented.

The device according to the present invention comprises: a control unit for executing operation control of the device; a case unit constituting a housing of the device and incorporating the control unit therein; a plurality of memory card units, arranged inside the case unit, for respectively storing a plurality of memory cards serving as external memory media of the device; and card interface means, respectively connected to the memory cards inserted in the memory card units, for interfacing the control unit with the memory cards.

A large external memory system consisting of memory cards can be achieved by using a plurality of memory cards. Therefore, the memory capacity is not limited to the small capacity of one memory card, and an external memory system consisting of a practical large-capacity memory card system can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a perspective view showing an arrangement of a lap-top type personal computer according to the first embodiment of the present invention;

FIG. 2 is a plan view showing an arrangement of a memory card according to the first embodiment of the present invention;

FIG. 4 is a block diagram showing a circuit arrangement of a lap-top personal computer according to the second embodiment of the present invention;

DETAILED DESCRIPTION OF THE PREFERRED EMBODIMENTS

Figure 3:
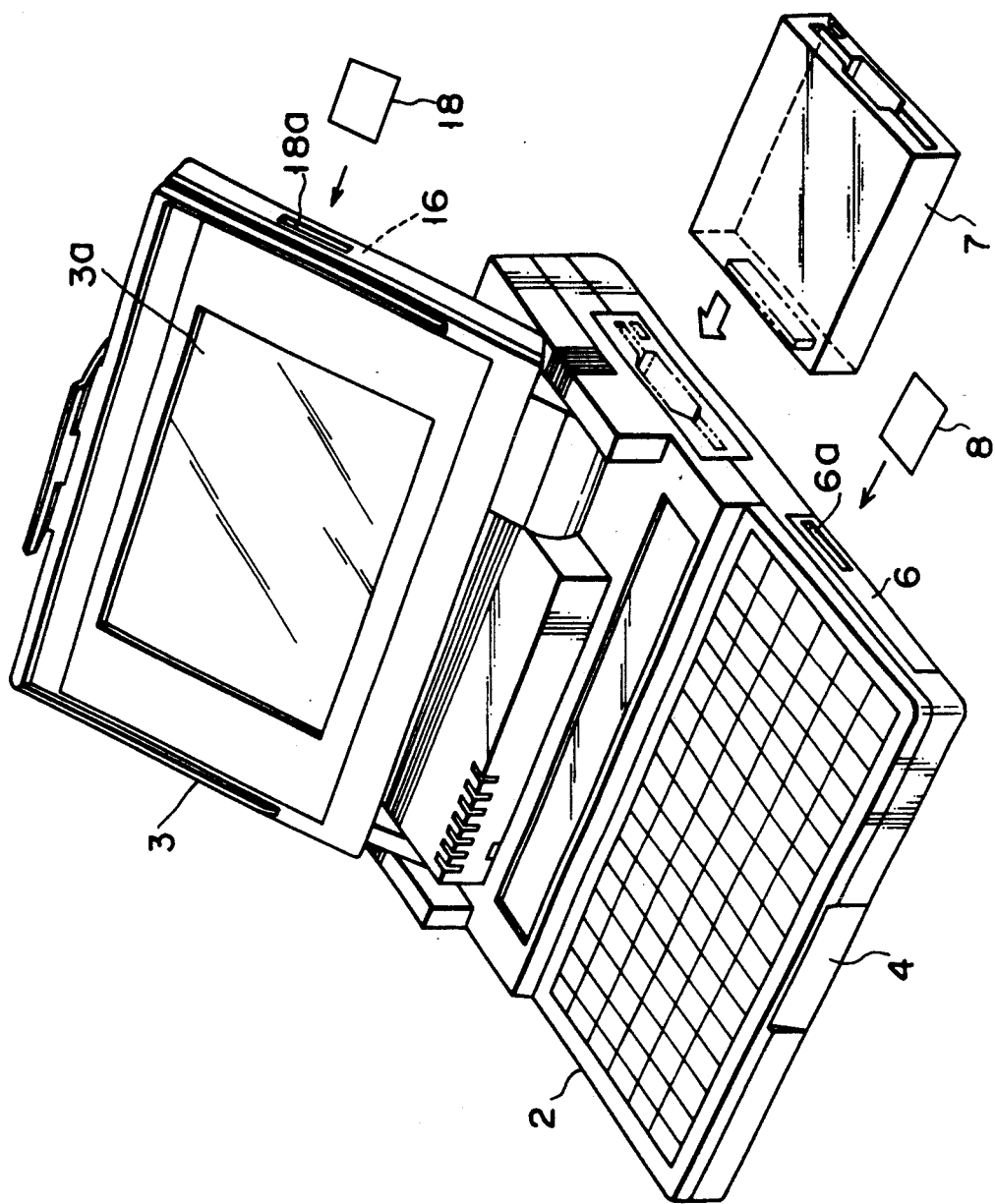
FIG. 3 is a perspective view showing an arrangement 0 of a lap-top type personal computer according to the second embodiment of the present invention.

The first embodiment of the present invention will be described with reference to the accompanying drawings.

As shown in FIG. 1, a device of this embodiment is a lap-top type personal computer. This personal computer comprises a keyboard 2 and a flat panel display unit 3 and uses a case unit 1 constituting a device housing as a base. The keyboard 2 is mounted on the front surface portion of the case unit 1 and has a plurality of key switches. A handle 4 is mounted on the front surface portion of the case unit 1 and is used to carry the device housing. The display unit 3 comprises, e.g., an LCD (Liquid Crystal Display) panel 3a and is mounted on the rear surface portion of the case unit 1. The display unit 3 is mounted on the case unit 1 by a pivotal connecting member 5. When the computer is not used, a display panel 3a is pivoted about the connecting member 5 in a direction to come close to the keyboard 2, and the display unit 3 is closed at the front surface portion of the case unit 1.

A memory card unit 6 and an FDD (Floppy Disk Drive) unit 7 are incorporated in a side surface portion of the case unit 1. The memory card unit 6 is located at the front surface portion of the case unit 1 under the keyboard 2.

The memory card unit 6 has a box-like case for receiving a memory card 8 inserted from a card slot 6a formed in the side surface of the case unit 1.

The memory card 8 comprises a housing as a card base made of a plastic plate-like member. A memory circuit consisting of integrated circuits (LSIs) is mounted on the card base. The memory circuit comprises a ROM (Read-Only Memory) or an RWM (Read/Write Memory or so-called RAM).

A connector 10 having a plurality of terminals (contact holes) is arranged at the distal end portion of the card base, as shown in FIG. 2. The connector 10 has high-voltage power source terminals 11 at its center and a plurality of other terminals symmetrical about the high-voltage power source terminals 11. The high-voltage power source terminals 11 are used to supply a power source voltage (e.g., 5 V) necessary for an operation of a memory circuit 12 mounted on the card 8. The power source is arranged inside the case unit 1 and is used as a power source for operating the computer as a whole.

On one side with respect to the high-voltage power source terminals 11 as central terminals, a control signal terminal C2, data I/O terminals D0 to D7, address terminals A4 to A7, and ground terminals GND2 and GND3 are arranged. On the other side, a control signal terminal C1, data I/O terminals D8 to D15, address terminals A0 to A3, and ground terminals GND0 and GND1 are arranged. These terminals are connected to the memory circuit 12.

The memory card unit 6 comprises a connector 20 corresponding to the connector 10 of the memory card 8. The connector 20 has connecting pins respectively corresponding to the terminals of the card 8 and is connected to the printed circuit board arranged inside the case unit 1. LSIs such as a central processing unit (CPU) and a card interface (C-IF) necessary for computer operations are mounted on the printed circuit board.

As shown in FIG. 1, when the memory card 8 is inserted into the card slot 6a of the card unit 1, the memory card 8 is stored in the memory card unit 6. In the unit 6, the connector 10 of the memory card 8 is connected to the connector 20 of the unit 6. The memory card 8 is electrically connected to the printed circuit board arranged inside the case unit 1. Therefore, the CPU mounted on the printed circuit board can access the memory card 8 through the C-IF. That is, the CPU can use the memory card 8 as an external memory unit as in the FDD.

Assume that the memory card 8 is inserted upside down into the memory card unit 6 through the card slot 6a. In this erroneous insertion, the right (left) side of the connector 10 of the card 8 is connected to the left (right) side of the connector 20 of the unit 6 with respect to the high-voltage power source terminals 11 as central terminals. More specifically, in a normal connecting state, the control signal terminal C2, the data I/O terminals D0 to D7, the address terminals A4 to A7, and the ground terminals GND2 and GND3 are respectively connected to the control signal terminal C1, the data I/O terminals D8 to D15, the address terminals A0 to A3, and the ground terminals GND0 and GND1. Even if the connector 10 is reversely connected to the connector 20, since the high-voltage power source terminals 11 are located at the central portion of the connector 10, the terminals of the connector 10 can be connected to the proper pins of the connector 20, respectively, as in the normal insertion. Therefore, even if the connector 10 is inserted upside down, a high voltage from the power source in the case unit 1 will not be applied to any terminal (e.g., the data I/O terminal) except for the high-voltage power source terminals 11.

The terminals except for the high-voltage power source terminals 11 are arranged symmetrically about the high-voltage power source terminals 11. Even if the terminals are reversely connected when the card 8 is inserted upside down, the terminals of the card 8 are connected to the corresponding types of terminal pins of the connector 20.

Even if the memory card 8 according to the present invention is inserted upside down into the memory card unit 6, the high-voltage power source terminals 11 can be appropriately connected to the corresponding terminals of the connector 20. Unlike in the conventional case, an abnormal circuit is not formed upon connection of the data I/O terminals of the memory card to the high-voltage power source terminals of the connector 20 of the unit 6 when the card is inserted upside down. Since formation of an abnormal circuit can be prevented as described above even if the memory card 8 is inserted upside down, an abnormal current is not supplied to, e.g., the memory circuit 12 or a CPU mounted on the printed circuit board of the computer, and a malfunction of one or both of the memory circuit 12 and the circuit on the printed circuit board can be prevented.

In the first embodiment, the high-voltage power source terminals 11 are arranged at the central portion of the connector 10 of the memory card 8. However, the layout of the terminals is not limited to this. For example, the ground terminals may be arranged at the central portion in place of the high-voltage power source terminals 11. In this case, the high-voltage power source terminals 11 are located at any of the ground terminals GND0 to GND3. As a matter of course, the positions of the control signal terminals C1 and C2, the data I/O terminals D0 to D15, and the address terminals A0 to A7 are not limited to specific positions if they are symmetrical about the power source terminals (high-voltage power source terminals or the ground terminals).

The second embodiment of the present invention will be described with reference to FIGS. 3 to 6.

As shown in FIG. 3, a device of this embodiment is similar to the lap-top type personal computer as in the first embodiment. The personal computer comprises a memory card unit 6 arranged in the side surface portion of a case unit 1 and another memory card unit 16 arranged in the side surface portion of a display unit 3. The memory card unit 16 has a box-like case for storing a memory card 18 similar to a memory card 8.

The memory card 18 comprises a housing consisting of a card base of, e.g., a plastic plate-like member as in the card 8. A memory circuit consisting of integrated circuits (LSIs) is mounted on the card base. The memory circuit comprises a ROM or RWM. When the memory card 18 is inserted into a card slot 18a formed in the side surface of the display unit 3, the card 18 is connected to a connector (i.e., a connector 30 shown in FIG. 5) of the unit 16. The connector of the unit 16 is connected to a printed circuit board arranged inside the case unit 1.

As shown in FIG. 4, the computer comprises a CPU 31 for executing data processing, a system bus 60, and a card interface (C-IF) 61 inside the case unit 1. The CPU 31 is connected to the C-IF 61 through the system bus 60. The C-IF 61 is an interface for transferring data, address, and various control signals between the CPU 31 and the memory cards 8 and 18. The C-IF 61 is electrically connected to the connectors 20 and 30 arranged on the units 6 and 16 for respectively storing the memory cards 8 and 18. The CPU 31, the system bus 60, and the C-IF 61 are mounted on the printed circuit board.

The computer further includes a ROM 32 for storing programs of the CPU 31, a RAM 33 for storing data necessary for data processing of the CPU 31, a direct memory access controller (DMAC) 34, a programmable interrupt controller (PIC) 35, a programmable interval timer (PIT) 36, a real-time clock (RTC) 37 having an independent operating battery, and a backup RAM (BK-RAM) 38 used as a data storage area for realizing a resuming function. Even if a commercial AC voltage (AC) is not applied from a main power source of the computer, a voltage from the backup power source VBK is supplied from a power source circuit 40 to the RAM 33 and the BK-RAM 38.

The power source circuit 40 comprises a power control circuit (PC-CPU) which receives a DC voltage of a predetermined potential from an AC adapter 39 to supply an operating power to the respective components of the computer. The AC adapter 39 is a circuit for rectifying and smoothing an input AC power and outputting a DC voltage of a predetermined potential. The PC-CPU has a function of monitoring the entire internal power source of the computer. The power source circuit 40 receives DC voltages of a predetermined potential (i.e., the backup power sources VBK) from a rechargeable cartridge main battery (M-BATT) 41a and a rechargeable sub-battery (S-BATT) 41b incorporated in the case unit 1. A power source control interface (PS-IF) 49 connects the power source circuit 40 and the CPU 31 through the system bus 60.

The computer further includes a printer controller (PRT-CONT) 42 serving as an interface for a printer (PRT) 51 as an external device, a universal asynchronous receiver transmitter (UART) 43 as an I/O interface with an external device, a keyboard controller (KBC) 44 as an interface for a keyboard (KB) 2, and a display controller (DISP-CONT) 45. The UART 43 is connected to an interface 52 complying with, e.g., the RS-232C Standards. The DISP-CONT 45 is a control circuit for controlling display operations of an LCD display panel 3a and a CRT display unit (CRT) 53. The DISP-CONT 45 executes display operation control on the basis of the display data stored in a video RAM (VRAM) 46. The computer additionally includes a ROM 47 for prestoring character pattern data required for displaying operations of the display unit and printing operations at the printer, a ROM 48 serving as a dictionary memory required for wordprocessor functions, and an extension connector 50 for connecting an extended memory.

Figure 5:
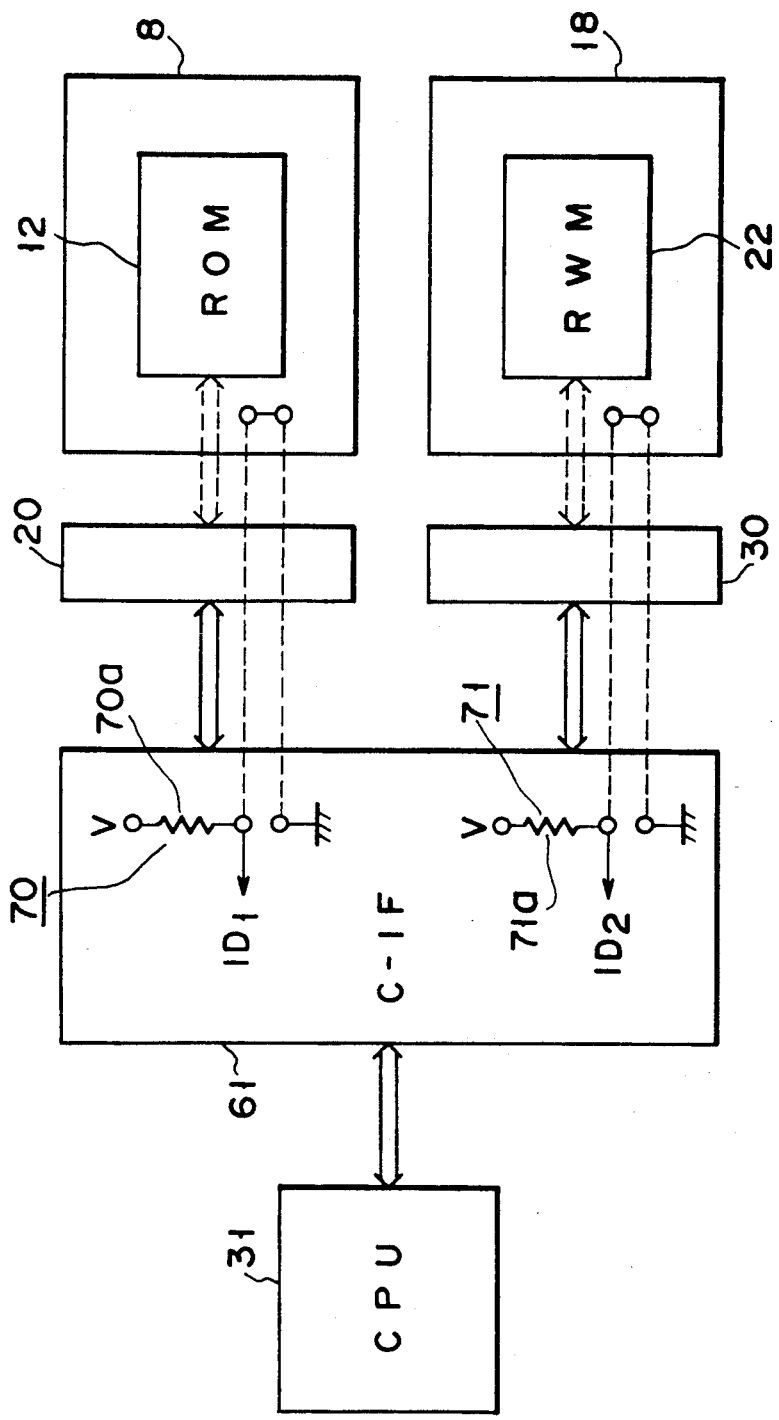
FIG. 5 is a block diagram showing an arrangement of a peripheral circuit of a memory card unit according to the second embodiment of the present invention.

FIG. 5 is a block diagram showing the computer system configuration when a plurality of memory cards (8 and 18) are used in the computer of the second embodiment.

The C-IF 61 includes card identification circuits 70 and 71 for identifying whether the memory cards 8 and 18 are set in the units 6 and 16, respectively. As shown in FIG. 5, the card identification circuit 70 is a circuit having a pull-up resistor 70a. When the memory card 8 is inserted into the unit 6 and is connected to the connector 20, an identification signal (a low-level voltage signal) ID1 is output from one terminal of the pull-up resistor 70a. Similarly, the card identification circuit 71 is a circuit including a pull-up resistor 71a. When the memory card 18 is inserted into the unit 16 and is connected to the connector 30, an identification signal (i.e., a low-level voltage signal) ID2 is output from one terminal of the pull-up resistor 71a to the CPU 31. The CPU 31 identifies from the identification signal ID1 or ID2 from the C-FI 61 whether the unit 6 or 16 is set in the memory card 8 or 18.

Figure 6:
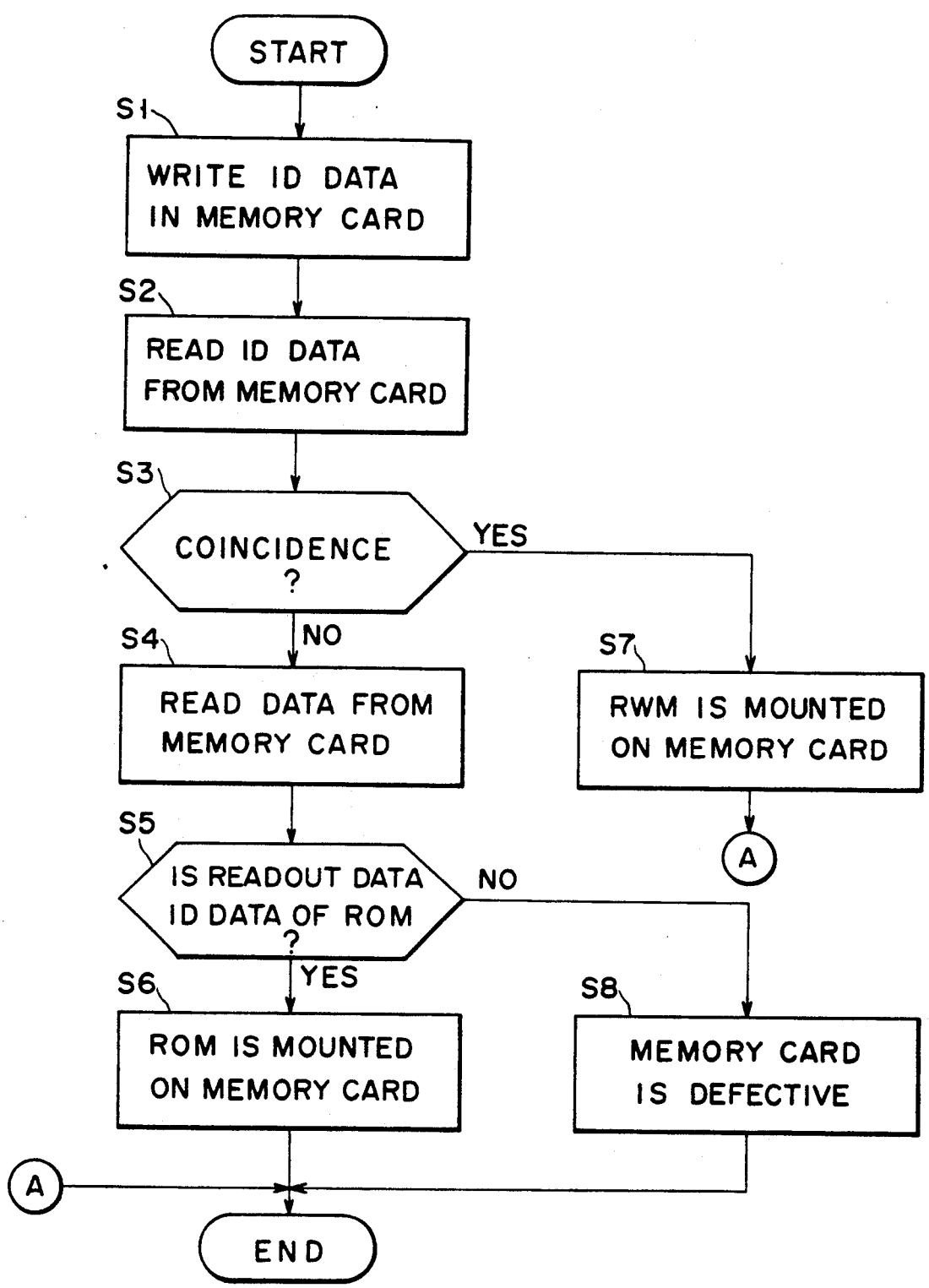
FIG. 6 is a flow chart for explaining an operation of the second embodiment.

The CPU performs identification processing for identifying the type of (ROM or RWM) of each memory circuit 12 or 22 set in the memory card 8 or 18 in accordance with a flow chart in FIG. 6.

In step S1, the CPU 31 accesses the memory cards 8 and 18 through the C-IF 61 and writes predetermined identification data at predetermined addresses. The CPU 31 then accesses the memory cards 8 and 18 through the C-IF 61 and reads out the identification data written in step S1 from the predetermined address (step S2). The CPU 31 compares the readout data with the written identification data to determine whether they coincide with each other (step S3).

As shown in FIG. 5, assume that a ROM is incorporated in the memory card 8 and that an RWM is mounted in the memory card 18. When the readout data coincides with the written identification data (i.e., YES in step S3), the CPU 31 identifies that an RWM is mounted in the memory card 18 (step S7). However, if the readout data does not coincide with the written identification data (i.e., NO in step S3), the CPU 31 identifies that a ROM is mounted in the memory card 8. In this case, since identification data cannot be written in the ROM, data read out from the predetermined address of the ROM does not coincide with the identification data.

If NO in step S3, the CPU 31 reads out data from the predetermined address of the memory card 8 (step S4). The CPU 31 checks if the readout data coincides with the identification data prestored in the ROM (step S5). If the identification data is identified (i.e., YES in step S5), the CPU 31 identifies that a ROM is mounted in the memory card 8 (step S6). However, when the identification data is not identified (i.e., No in step S5), the CPU 31 identifies that neither an RWM nor a ROM are mounted in the memory card 8 and that the memory card 8 is malfunctioning (step S8).

The CPU 31 identifies types of memory circuits 12 and 22 of the plurality of memory cards 8 and 18 and executes memory control in accordance with the types of memory circuits. More specifically, since the memory card 8 incorporates a ROM, the CPU 31 accesses the memory card 8 and executes read processing of various prestored data (or program). Since the memory card 18 incorporates an RWM, the CPU 31 uses the memory card 18 as a memory such as an extended RWM. When RWMs are respectively mounted in the memory cards 8 and 18, the CPU 31 can use the cards 8 and 18 as a single memory space.

Since the plurality of memory cards 8 and 18 can be used as described above, the external memory can have a larger capacity than a configuration using a single memory card. Therefore, memory cards can be used as practical external memory media corresponding to an FDD disk. Although a single memory card has a small memory capacity and its application field is limited, this limitation can be eliminated by the present invention.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. A memory card unit comprising:
a card base constituting a card housing and mounted with a memory circuit; and
connector means for electrically connecting said memory circuit with an external device, said connector means being arranged on a distal end portion of said card base and being connectable to said external device, and having central terminals which are used as high-voltage power source terminals and connected to said memory circuit and data input/output, address, control signal and ground terminals which are connected to said memory circuit so as to be symmetrical with respect to said central terminals.

2. A memory card unit comprising:
a card base constituting a card housing and mounted with a memory circuit; and
connecting means for electrically connecting said memory circuit with an external device, said connecting means being arranged on a distal end portion of said card base and being connectable to said external device, and having central terminals which are used as ground terminals and connected to said memory circuit and data input/output, address, control signal and high-voltage power source terminals which are connected to said memory circuit so as to be symmetrical with respect to said central terminals.

3. A memory card system comprising:
a card base comprising a memory circuit mounted on a card housing;
an external device supplying power to the memory circuit, and interchanging data with the memory circuit; and
connector means for electrically connecting said memory circuit with said external device, said connector means being arranged on a distal end portion of said card base to be connected to said external device, and having central terminals used as high-voltage power source terminals which are connected to said memory circuit and data input/output, address, control signal and ground terminals which are connected to said memory circuit and arranged so as to be symmetrical with respect to said central terminals.

4. A memory card system comprising:
a card base comprising a memory circuit mounted on a card housing;
an external device supplying power to the memory circuit, and interchanging data with the memory circuit; and
connector means for electrically connecting said memory circuit with said external device, said connector means being arranged on a distal end portion of said card base to be connected to said external device, and having central terminals used as ground terminals which are connected to said memory circuit and data input/output, address, control signal and high-voltage power source terminals which are connected to said memory circuit and arranged so as to be symmetrical with respect to said central terminals.

* * * * *